(12) United States Patent
Burgess et al.

(10) Patent No.: US 11,875,980 B2
(45) Date of Patent: Jan. 16, 2024

(54) METHOD AND APPARATUS FOR DEPOSITING A MATERIAL

(71) Applicant: SPTS Technologies Limited, Newport (GB)

(72) Inventors: Stephen R Burgess, Gwent (GB); Rhonda Hyndman, Newport (GB); Amit Rastogi, Newport (GB); Eduardo Paulo Lima, Gwent (AE); Clive L Widdicks, Bristol (GB); Paul Rich, Gloucestershire (GB); Scott Haymore, Newport (GB); Daniel Cook, Newport (GB)

(*) Notice: Subject to any disclaimer, the term of this patent is extended or adjusted under 35 U.S.C. 154(b) by 0 days.

(21) Appl. No.: 17/139,445

(22) Filed: Dec. 31, 2020

(65) Prior Publication Data
US 2021/0123130 A1    Apr. 29, 2021

Related U.S. Application Data

(62) Division of application No. 15/084,574, filed on Mar. 30, 2016, now Pat. No. 10,900,114.

(30) Foreign Application Priority Data

Mar. 31, 2015 (GB) ..................................... 1505578

(51) Int. Cl.
*H01J 37/34* (2006.01)
*C23C 14/34* (2006.01)
(Continued)

(52) U.S. Cl.
CPC ...... *H01J 37/3458* (2013.01); *C23C 14/0617* (2013.01); *C23C 14/10* (2013.01);
(Continued)

(58) Field of Classification Search
CPC ............... H01J 37/3408; H01J 37/3467; H01J 37/3461; H01J 37/3458; H01J 37/345;
(Continued)

(56) References Cited

U.S. PATENT DOCUMENTS 6,132,575 A * 10/2000 Pandumsoporn ..... C23C 14/358
204/298.06
6,342,134 B1 * 1/2002 Barber .................... C23C 14/35
204/192.18
(Continued)

FOREIGN PATENT DOCUMENTS

JP    2001279438 A    10/2001
JP    2005510045 A    4/2005
(Continued)

OTHER PUBLICATIONS

JPO, First Office Action for JP Application No. 2021-011067, dated Feb. 15, 2022.

*Primary Examiner* — Michael A Band
(74) *Attorney, Agent, or Firm* — Hodgson Russ LLP

(57) ABSTRACT

A method is for depositing a dielectric material on to a substrate in a chamber by pulsed DC magnetron sputtering with a pulsed DC magnetron device which produces one or more primary magnetic fields. In the method, a sputtering material is sputtered from a target, wherein the target and the substrate are separated by a gap in the range 2.5 to 10 cm and a secondary magnetic field is produced within the chamber which causes a plasma produced by the pulsed DC magnetron device to expand towards one or more walls of the chamber.

9 Claims, 6 Drawing Sheets

(51) Int. Cl.
- *C23C 14/06* (2006.01)
- *C23C 14/35* (2006.01)
- *C23C 14/10* (2006.01)
- *H01J 37/32* (2006.01)

(52) U.S. Cl.
CPC ........ *C23C 14/345* (2013.01); *C23C 14/3485* (2013.01); *C23C 14/35* (2013.01); *C23C 14/351* (2013.01); *H01J 37/32669* (2013.01); *H01J 37/32688* (2013.01); *H01J 37/345* (2013.01); *H01J 37/3411* (2013.01); *H01J 37/3426* (2013.01); *H01J 37/3461* (2013.01); *H01J 37/3467* (2013.01); *H01J 37/3408* (2013.01)

(58) Field of Classification Search
CPC .............. H01J 37/3426; H01J 37/3411; H01J 37/32688; H01J 37/32669; H01J 37/3435; C23C 14/0617; C23C 14/345; C23C 14/3485; C23C 14/35; C23C 14/351; C23C 14/3407

See application file for complete search history.

(56) References Cited

U.S. PATENT DOCUMENTS

| | | | |
|---|---|---|---|
| 8,834,685 B2* | 9/2014 | Morimoto | C23C 14/046 204/192.12 |
| 2008/0142359 A1* | 6/2008 | Gopalraja | H01J 37/3455 204/298.16 |

FOREIGN PATENT DOCUMENTS

| | | |
|---|---|---|
| JP | 2009149953 A | 7/2009 |
| WO | 2008136504 A1 | 6/2009 |

* cited by examiner

METHOD AND APPARATUS FOR DEPOSITING A MATERIAL

BACKGROUND

This invention relates to a method of depositing a material onto a substrate in a chamber by magnetron sputtering and to associated apparatus.

Magnetron sputtering is a well known example of PVD (Physical Vapour Deposition). Magnetron sputtering is used to deposit a range of films onto a range of substrates. For example, it is known to deposit AlN films by pulsed DC magnetron sputtering. The AlN film can be deposited with a defined crystallographic orientation which gives rise to piezoelectric properties. The deposited film can thus form a resonating structure at certain defined RF frequency bands. Films of this type have application for example in the manufacture of bulk acoustic wave (BAW) devices which are used as filters for RF frequencies. Typically, a BAW device having a surface area of a few mm$^2$ is fabricated on a circular silicon substrate. The silicon substrate may be 200 mm in diameter. The resonating frequency of the piezoelectric AlN film is a first order function of film thickness and its acoustic properties. Accordingly, the non uniformity in AlN thickness across the substrate must be very low in order to allow the filters to work in the correct RF filter frequency band. Typically, a non uniformity (NU %) in the AlN thickness should be less than 1%.

It is a known problem with PVD of AlN that the thickness of the deposited film over the radially outermost part of the substrate drops off markedly. For 200 mm diameter silicon wafers, the radially outermost 15 mm of the wafer is particularly susceptible to a substantial drop off in the AlN film thickness. The drop off is such that BAW filters cannot be made from this part of the wafer unless additional process steps are carried out to accommodate this intrinsic variation in film thicknesses. FIG. 1 shows two line scans of AlN film thickness (Angstroms) as a function of silicon wafer radius (mm) one at 90° to the other for depositions onto a first 1 and second 2 wafer. The drop off in film thickness becomes noticeable in the outer 20 mm of the wafer, and is particularly pronounced in the outermost 15 mm of the wafer. The outermost 15 mm of the wafer represents an area of 87 cm$^2$ for a 200 mm diameter wafer, where the full surface area is 314 cm$^2$. This represents a loss of 28% of the available silicon for processing.

SUMMARY

It will be appreciated that it is generally desirable to achieve a uniform deposited film thickness from magnetron sputtering because it is generally desirable for a manufacturing process to provide homogenous results. Accordingly, the present invention is not limited to the deposition of AlN films.

The present invention, in at least some of its embodiments, addresses the above described problems.

According to a first aspect of the invention there is provided a method of depositing a dielectric material onto a substrate in a chamber by pulsed DC magnetron sputtering with a pulsed DC magnetron device which produces one or more primary magnetic fields;

in which a sputtering material is sputtered from a target, wherein the target and the substrate are separated by a gap in the range 2.5 to 10 cm and a secondary magnetic field is produced within the chamber which causes a plasma produced by the pulsed DC magnetron device to expand towards one or more walls of the chamber.

The substrate may have a width which is 150 mm or greater.

The target may have a width and the substrate may have a width. The width of the target may be greater than the width of the substrate. In these instances the width of the plasma is greater than the width of the substrate and it is counter-intuitive that it might be advantageous to expand the plasma further. Typically, the widths of the target and the substrate are each a radius. In principle, the target and the substrate may be differently shaped and the width may correspond to one or more different linear dimensions.

The secondary magnetic field may be created using an electromagnet. The secondary magnetic field may be created by applying a DC electrical current to a coil. The coil may be disposed around the periphery of the chamber. Typically, the magnetron device is located at an upper region of the chamber and the coil is disposed around a main body portion of the chamber which lies below the upper region of the chamber. The coil may in principle be disposed within the chamber. However, this is believed to be a less practical arrangement.

The electromagnet may be a single electromagnet or a series of electromagnets having aligned polarities so that all of the electromagnets cause the plasma produced by the magnetron device to expand towards one or more walls of the chamber.

Alternatively, the secondary magnetic field may be created using a permanent magnet. However, it can be advantageous to use an electromagnet, because it is easier to fine tune the secondary magnetic field to produce optimal performance.

In general, the secondary magnetic field is produced so as to provide an increased thickness of the deposited material in a peripheral portion of the substrate.

The secondary magnetic field may cause ions to be steered away from a peripheral portion of the substrate. The secondary magnetic field may attract electrons towards one or more walls of the chamber to produce a drift electric field which steers ions away from a peripheral portion of the substrate.

The secondary magnetic field may extend generally axially in the chamber in a region between the walls of the chamber and the substrate.

The material may be deposited using pulsed DC magnetron sputtering. The invention is believed to be particularly effective when used in conjunction with pulsed DC magnetron sputtering or any other magnetron sputtering technique which produces a high density of ions.

The material may be deposited by reactive sputtering.

The deposited dielectric material may be AlN. The deposited dielectric material may be a silicon oxide.

A negative bias potential may be applied to a substrate support on which the substrate is disposed.

The plasma may be produced in a gas mixture which comprises Argon. Other Noble gases might be contemplated.

Ar$^+$ ions may be steered away from the peripheral portion of the substrate.

The substrate may be a semiconductor substrate, such as a semiconductor wafer. The substrate may be a silicon substrate. The substrate may be a wafer having a radius of 200 mm or 300 mm.

According to a second aspect of the invention there is provided a PVD apparatus for depositing a dielectric material onto a substrate by pulsed DC magnetron sputtering comprising:

a chamber;

a pulsed DC magnetron device which produces one or more primary magnetic fields, the pulsed DC magnetron device comprising a target from which a sputtering material can be sputtered;

a substrate support disposed in the chamber;

a secondary magnetic field production device which is configured so that, in-use, the target and the substrate are separated by a gap in the range 2.5 to 10 cm; and a controller configured to control the secondary magnetic field production device so that a secondary magnetic field is produced within the chamber while the dielectric material is being deposited which steers electrons towards one or more walls of the chamber to produce a drift electric field which steers ions away from a peripheral portion of the substrate.

The substrate support may be configured to support a substrate having a width which is 150 mm or greater.

The target may have a width. The substrate support may be configured to support a substrate which has a width. The width of the target may be greater than the width of the substrate.

The secondary magnetic field production device may be an electromagnet. The electromagnet may be a single electromagnet or a series of electromagnets having aligned polarities so that all of the electromagnets produce magnetic fields which steer electrons towards one or more walls of the chamber to produce a drift electric field which steers ions away from a peripheral portion of the substrate.

The secondary magnetic field production device may comprise a coil disposed around the periphery of the chamber and an electrical supply for supplying DC electrical current to the coil.

The pulsed DC magnetron device may be a balanced magnetron or an unbalanced magnetron.

The apparatus may further comprise the substrate.

According to a third aspect of the invention there is provided a method of manufacturing a bulk acoustic wave device which comprises depositing a dielectric material onto a substrate using a method in accordance with the first aspect of the invention.

Whilst the invention has been described above, it extends to any inventive combination of the features set out above, or in the following description, drawings or claims.

BRIEF DESCRIPTION OF THE DRAWINGS

Embodiments of apparatus and methods in accordance with the invention will now be described with reference to the accompanying drawings, in which.

DETAILED DESCRIPTION OF EMBODIMENTS

Figure 3:
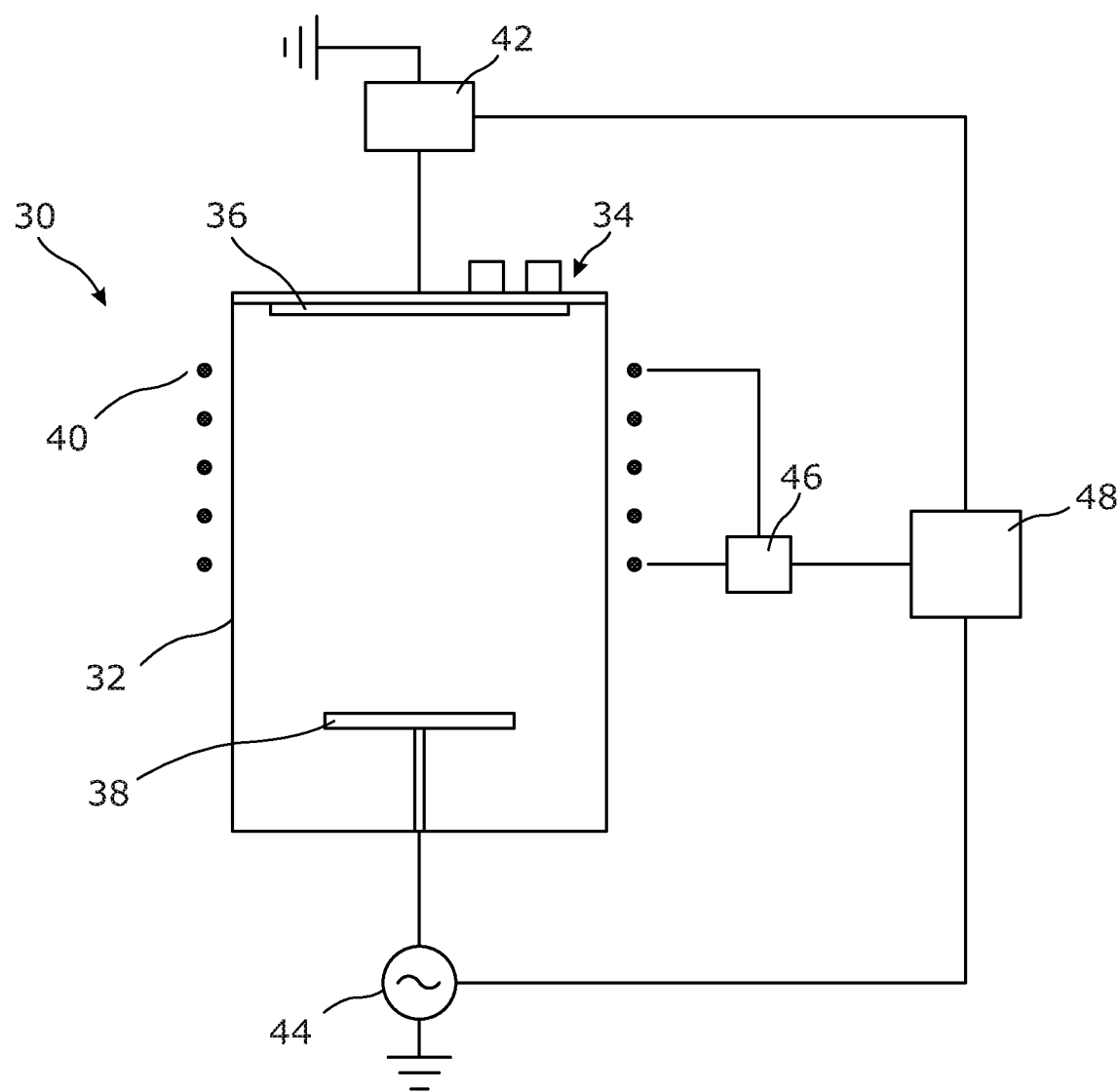
FIG. 3 shows a PVD apparatus of the invention.

FIG. 3 shows a PVD apparatus of the invention, depicted generally at 30. The apparatus 30 comprises a chamber 32 which contains a DC magnetron device 34, a target 36 from which material is sputtered by the magnetron device 34, and a substrate support 38 which supports a substrate (not shown) on which a desired material is deposited. The apparatus 30 further comprises a coil 40 which is disposed around the main body portion of the chamber 32. In the embodiment shown in FIG. 3, the chamber is cylindrical, although in principle other chamber shapes and other coil cross sectional shapes might be utilised. For presentation simplicity, other common aspects of magnetron sputtering devices, such as gas inlets and outlets are not shown in FIG. 3.

Pulsed DC power is applied to the target 36 from a DC power supply 42. DC power is applied to the coil 40 by a coil DC electrical supply 46 which enables the applied current to be varied. RF power is applied to the substrate support 38 from a RF power supply 44 in order to negatively bias the substrate support. Typically, the substrate support 38 is driven at 13.56 MHz out of convention, although the invention is not limited in this regard. The operation of the power supplies 42, 44, 46 is controlled with a controller 48. The controller 48 may be a computer having a suitable graphical user interface.

Figure 1:
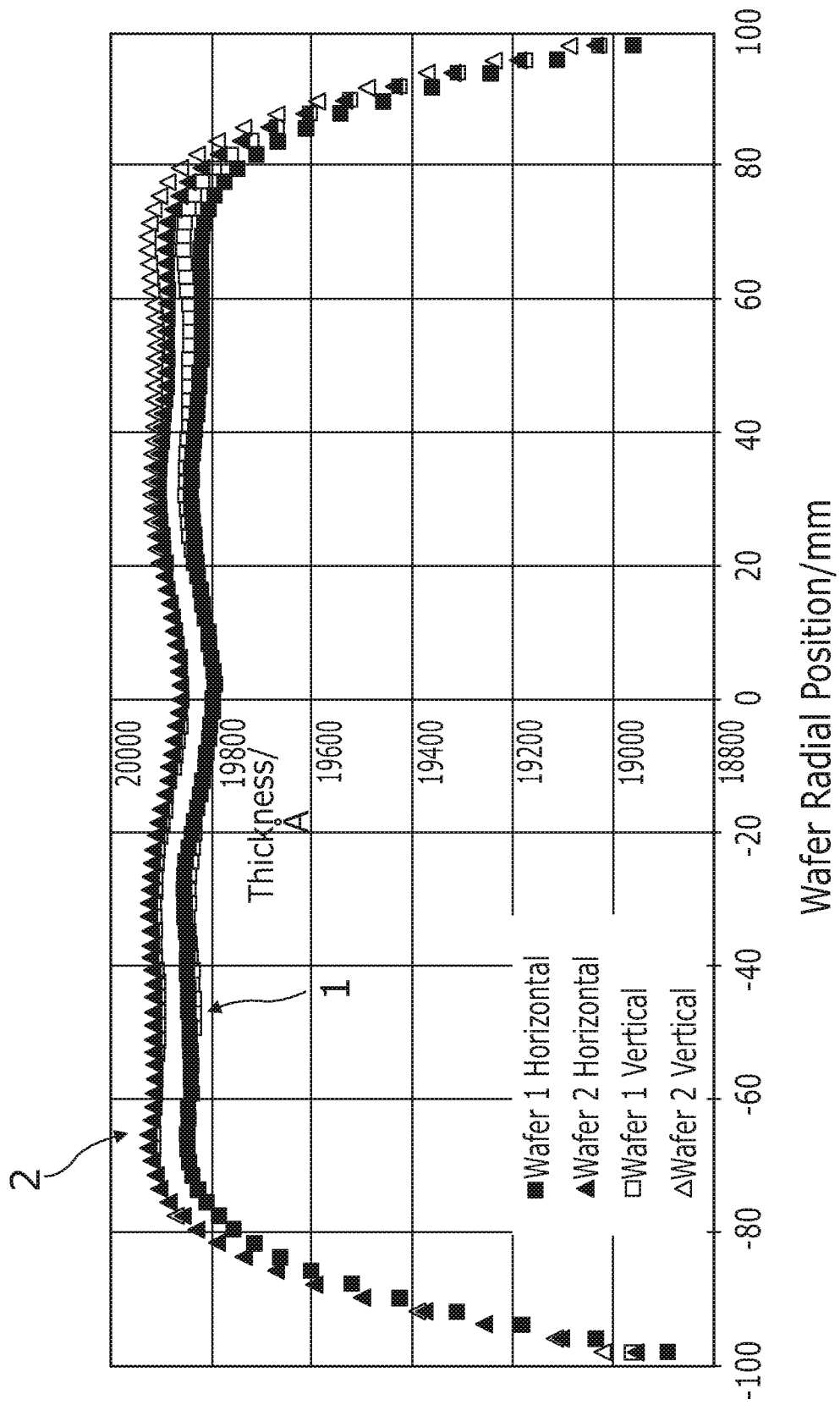
FIG. 1 shows AlN film thickness as a function of wafer radial position for a prior art deposition process.
Figure 2:
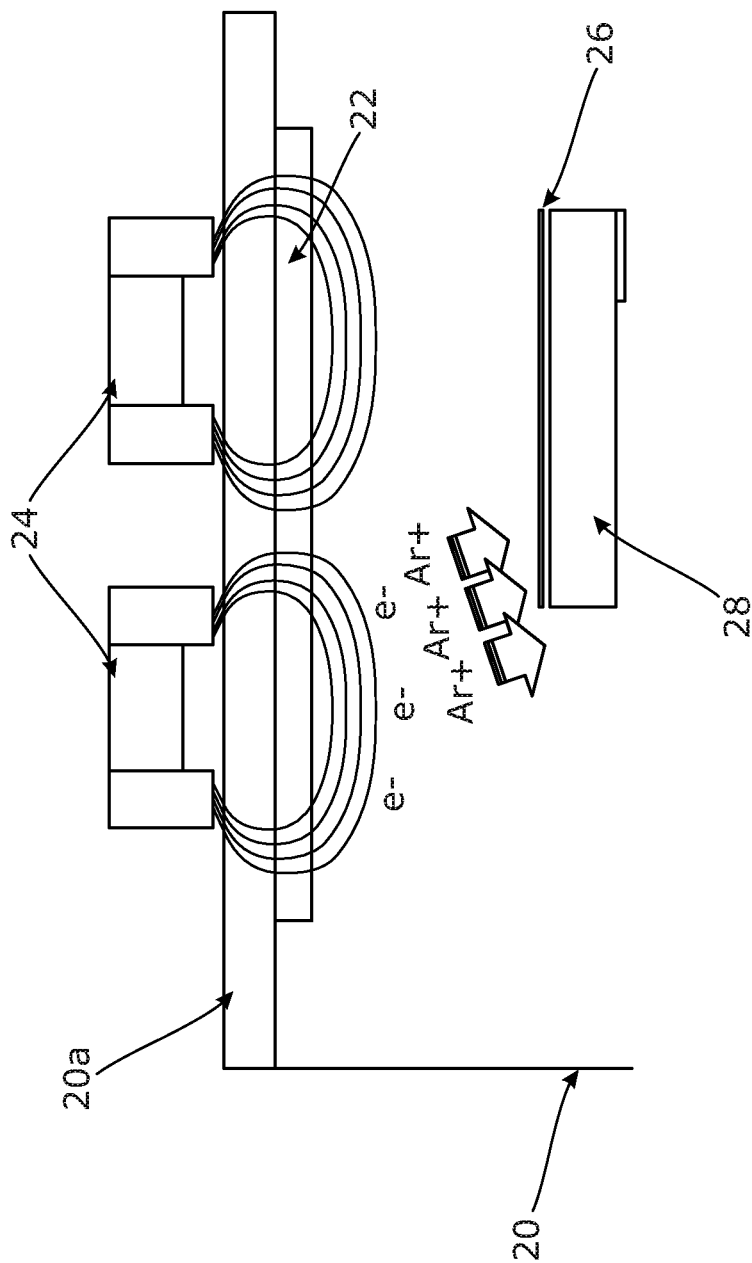
FIG. 2 is a semi-schematic cross sectional view of a portion of a prior art DC magnetron system being used to deposit AlN.

The problems with film uniformity associated with the deposition of materials such as AlN have been described above. The present inventors believe that they have found the reason for the reduced thickness of the deposited AlN film at the periphery of the wafer. Without wishing to be bound by any particular theory or conjecture, it is believed that the reduced film thickness at the periphery of the wafer is due to sputtering by positively charged ions. This is depicted in FIG. 2, which shows a portion of a DC magnetron system comprising a chamber 20 having a target backing plate 20a which acts as a lid portion. A target 22 is bonded to the target backing plate 20a. A pair of rotatable magnets 24 are positioned opposite the face of the target backing plate distant from the target 22. A wafer 26 is positioned on a platen 28 which can be RF driven to produce a negative DC bias. A mixture of argon and nitrogen is introduced into the chamber and a pulsed, negative, high DC voltage is applied to the target backing plate 20a/target 22 which thereby acts as a cathode. This creates a high density plasma which includes Ar and AlN ions. The wafer 26 sits inside the main erosion track of the cathode which is dictated by the rotating path of the magnets 24. It is believed that a proportion of the ions escape the negative glow of the plasma and move towards the platen 28. It is also believed that the negative bias on the platen 28 acts to attract positively charged ions such as $Ar^+$ to the edge of the wafer 26, causing the deposited AlN film to be thinned in this region by sputter etching. Al and N cations may cause some sputter etching as well.

Figure 4:
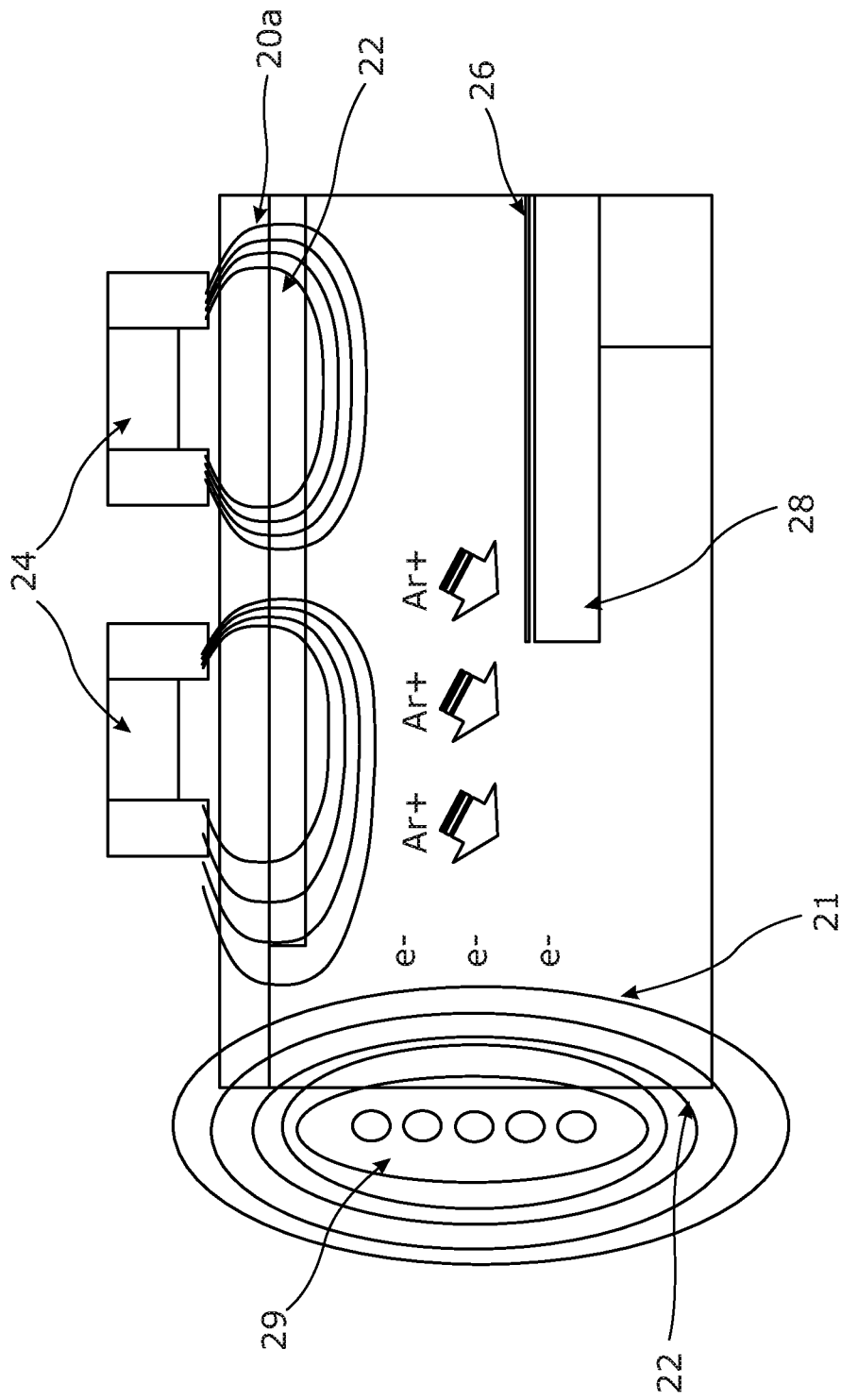
FIG. 4 is a semi-schematic cross sectional view of a portion of a DC magnetron system of the invention being used to deposit AlN.

FIG. 4 shows a portion of an apparatus of the invention which shares many of the features of the prior art apparatus shown in FIG. 2. Accordingly, identical numerals have been used in FIG. 4 to describe these shared features. The embodiment of the invention shown in FIG. 4 further comprises a multiple turn coil 29 which is positioned around the main body section of the chamber 20. The coil 29 is supplied with DC current from a DC electrical supply (not shown). FIG. 4 also shows secondary magnetic field lines which are generated by the energised coil 29. It can be seen that the magnetic field 21 lines generated in the interior of the chamber 20 extend generally axially along the chamber close to the chamber walls of the main body section. The effect of the secondary magnetic field generated by the coil 29 is to cause an expansion of the plasma towards the walls of the main body section of the chamber 20. Without wishing to be bound by any particular theory or conjecture, it is believed that the secondary magnetic field attracts electrons from the cathode which in turn sets up a drift electric field that steers ions away from the edge of the wafer 26. This reduces sputter etching at the edge of the wafer. Thus, it is believed that the invention can reduce the number of positive ions moving towards the wafer edge which would otherwise sputter etch the edge region of the wafer by steering these positive ions towards the chamber walls. As the number of positive ions impacting the edge region of the wafer is reduced, it is believed that the localised thinning effect in this region of the wafer caused by ion bombardment are also reduced. This results in improved deposited film uniformity.

Experiments have been performed using apparatus in accordance with FIGS. 2 and 4 to deposit AlN films on silicon substrates. The deposition process conditions used as shown in Table 1.

TABLE 1

Process Conditions for AlN Film Deposition

| Process Step | Parameter (Typical) | Parameter Range |
|---|---|---|
| Pulsed DC power (kW) | 5 | 1-10 |
| Pulse frequency (kHz) & duration (μsec) | 10, 4 | 5-100, 1-10 |
| Chamber Pressure (mT) | 3 | 1-10 |
| Gas flows (sccm) | 20Ar/40N$_2$ | 5-40Ar/5-80N$_2$ |
| Platen temperature (° C.) | 150 | 100-400 |
| Substrate bias (Volts) | −35 | −20-45 |
| Target to wafer separation (cm) | ~4.5 | 3-9 |

Figure 5:
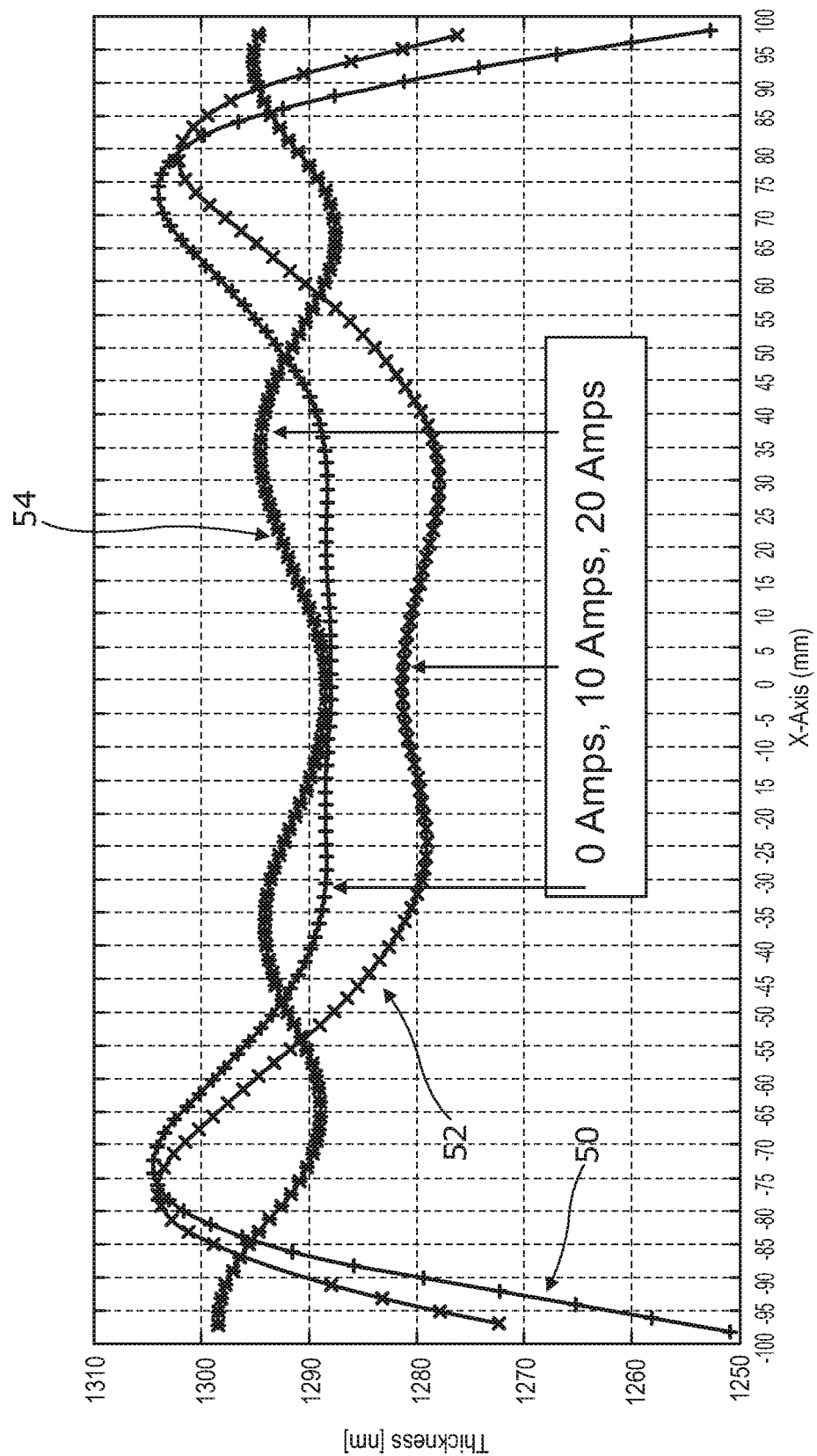
FIG. 5 shows AlN film thickness as a function of wafer radial position for a number of DC current values in the DC coil.
Figure 6:
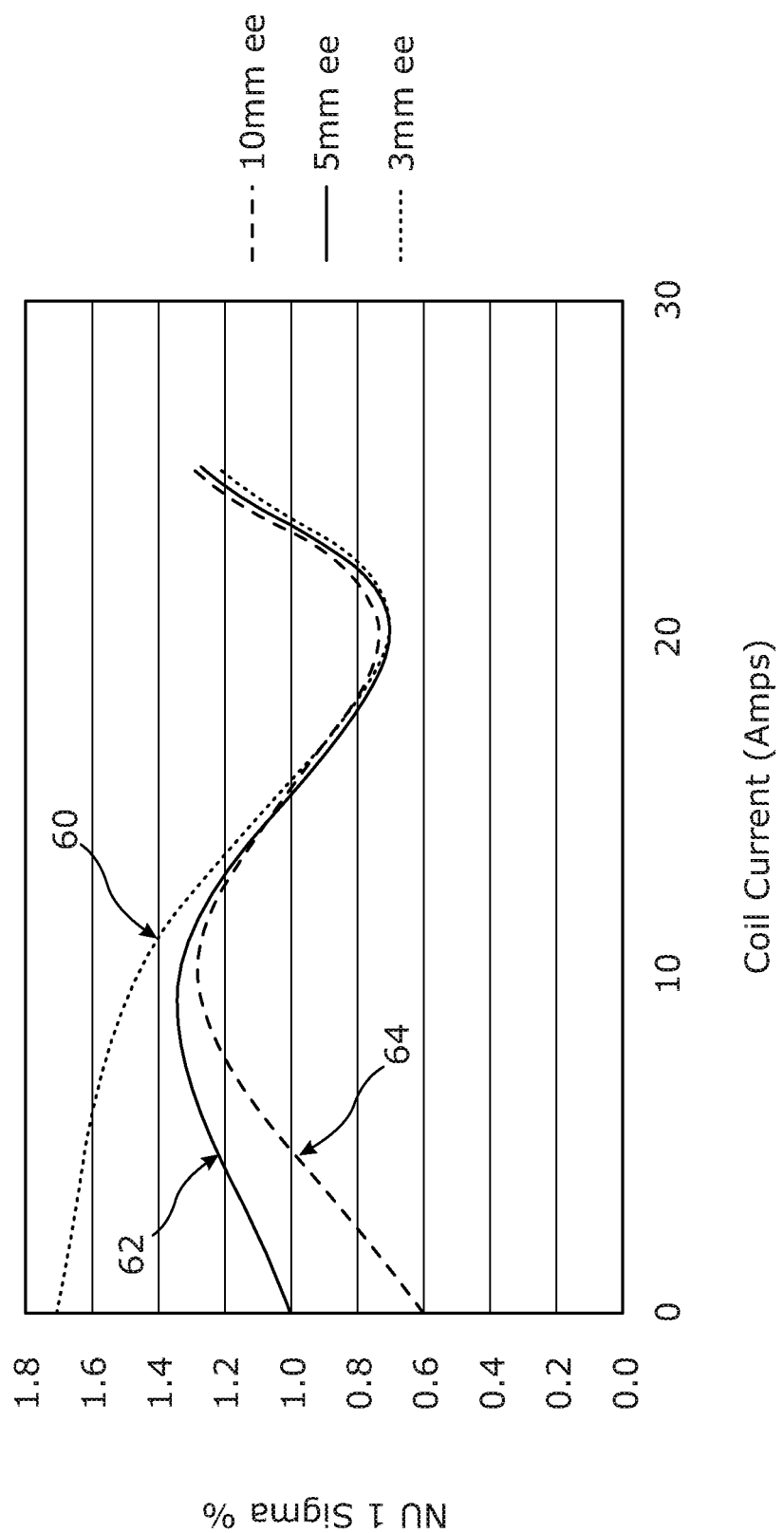
FIG. 6 shows within wafer non-uniformity of deposited AlN film for a number of DC current values in the DC coil.

Various DC currents were applied to the coil producing the secondary magnetic field (corresponding to the coils 29 and 40 shown in FIGS. 4 and 3, respectively). More specifically 0 A, 10 A and 20 A currents were used in conjunction with a 33 turn coil. FIG. 5 shows the AlN deposited film thickness as a function of the radial position on the wafer for films deposited using these DC currents. The line 50 shows film thickness when no current was applied, the line 52 shows film thickness with a 10 A current, and the line 54 shows film thickness with a 20 A current. It can be seen that when a 20 A current was used to generate the secondary magnetic field, there was no drop off in AlN film thickness at the edge of the silicon wafer. FIG. 6 shows film within wafer (WIW) thickness non-uniformity expressed as 1 sigma % standard deviation for a 49 point polar measurement for 3, 5 and 10 mm edge exclusions (ee) as a function of DC coil current applied to the coil that generates the secondary magnetic field. The lines 60, 62, 64 correspond to the 3, 5 and 10 mm edge exclusions, respectively. FIG. 6 shows that with no applied DC current, the non-uniformity is high at 3 and 5 mm edge exclusion, which is due to the drop off in the film thickness at the wafer edge. At 20 A applied DC current, the within wafer non-uniformity is essentially the same for 3, 5 and 10 mm edge exclusion. It can be seen that for the system and process conditions associated with these experiments, the optimal secondary magnetic field is generated with an applied DC current of around 20 A. It can also be seen that excellent results are achieved. In fact, processing to a 3 mm edge exclusion is considered to be state of the art. The use of an electromagnet to generate a secondary magnetic field is advantageous, because it allows the strength of the field to be easily varied in order to achieve an optimal result. In the example provided herein, the optimised magnetic field is 33×20=660 Amp turns. For any given implementation, the optimised magnetic field can be readily derived using the principles provided herein.

The present invention can be applied to a wide range of PVD systems. It is possible to produce bespoke systems embodying the invention and it is also possible to readily retrofit existing PVD systems.

What is claimed is:

1. A PVD apparatus for depositing a dielectric material on a substrate from a metallic target by pulsed DC magnetron sputtering comprising:
   a cylindrical chamber having a target backing plate;
   a rotating magnetron device which produces one or more primary magnetic fields in a vicinity of the metallic target located at a top of the chamber, wherein a sputtering material is sputtered from the metallic target, wherein the metallic target is powered by a pulsed DC magnetron device positioned on an opposite side of the target backing plate from the metallic target and outside the cylindrical chamber, wherein the metallic target has a target width;
   a DC power supply that provides a pulsed DC power to the metallic target from 1-10 kW;
   an RF driven substrate support disposed in the chamber which is orientated parallel to a surface of the metallic target at a distance from 2.5 cm to less than or equal to 5 cm and axially aligned with the metallic target, wherein a rotational path of the magnetron device behind the metallic target extends to beyond a diameter of a substrate on the substrate support, wherein the substrate support has a substrate support width, and wherein the target width is greater than the substrate support width;
   a gas inlet;
   a secondary magnetic field production device positioned around a body of the chamber between the metallic target and the substrate support which produces an axial secondary magnetic field that causes a plasma to expand towards a wall of the chamber, wherein the secondary magnetic field production device includes an electromagnet, wherein a density of field lines of the secondary magnetic field, in a cross sectional plane of the chamber in which an upper surface of the substrate support lies, is greatest in a region radially outwardly of the substrate adjacent the wall of the chamber, wherein the electromagnet is positioned such that the field lines extend axially along the wall of the cylindrical chamber, and wherein the electromagnet is disposed outside the chamber and extends around the wall of the chamber; and
   a controller configured to control the secondary magnetic field production device so that a secondary magnetic field is produced within the chamber while the dielectric material is deposited from the metallic target to produce an increase in thickness at a peripheral portion of the substrate, wherein the controller is further configured to control the pulsed DC power to the metallic target to be from 1-10 kW, a pulse frequency to be from 5-100 kHz, and a pulse duration to be from 1-10 μsec, and wherein the controller is further configured to operate the electromagnet using a DC current from 10-20 Amps such that the electromagnet has a magnetic field strength of 330-660 Amp turns.

2. The apparatus according to claim 1, wherein the substrate support is configured to support a substrate having a width which is 150 mm or greater.

3. The apparatus according to claim 1, wherein the electromagnet is a single electromagnet that produces a magnetic field which steers electrons towards the wall of the chamber to produce a drift electric field which steers ions away from the peripheral portion of the substrate.

4. The apparatus according to claim 1, wherein the electromagnet includes a series of electromagnets having aligned polarities so that all of the electromagnets produce magnetic fields which steer electrons towards the wall of the chamber to produce a drift electric field which steers ions away from the peripheral portion of the substrate.

5. The apparatus according to claim 1, wherein the electromagnet is at least partly a same height as the substrate support in the chamber.

6. The apparatus according to claim 1, wherein the metallic target includes aluminum.

7. The apparatus according to claim 1, wherein the gas inlet is in fluid communication with at least one gas source, wherein the at least one gas source includes argon and/or nitrogen.

8. The apparatus according to claim 1, wherein the dielectric material is aluminum nitride or silicon oxide.

9. The apparatus according to claim 1, wherein the controller is configured to control a pressure of the chamber from 1-10 mT during the depositing with an argon flow from 5-40 sccm, and wherein the controller is configured to control a negative bias potential of an RF power supply in electronic communication with the substrate support on which the substrate is disposed to be from 20-45 V.

* * * * *